United States Patent
Kluge

(10) Patent No.: US 10,473,743 B2
(45) Date of Patent: Nov. 12, 2019

(54) METHOD AND MAGNETIC RESONANCE APPARATUS FOR DETERMINING A SCAN SEQUENCE BASED ON A REPRESENTATION OF A PULSE RESPONSE IN K-SPACE OF THE GRADIENT SYSTEM

(71) Applicant: Siemens Healthcare GmbH, Erlangen (DE)

(72) Inventor: Thomas Kluge, Hirschaid (DE)

(73) Assignee: Siemens Healthcare GmbH, Erlangen (DE)

( * ) Notice: Subject to any disclaimer, the term of this patent is extended or adjusted under 35 U.S.C. 154(b) by 81 days.

(21) Appl. No.: 15/797,137

(22) Filed: Oct. 30, 2017

(65) Prior Publication Data
US 2018/0120397 A1   May 3, 2018

(30) Foreign Application Priority Data

Oct. 31, 2016   (DE) .................. 10 2016 221 397

(51) Int. Cl.
| | | |
|---|---|---|
| *G01R 33/48* | (2006.01) | |
| *G01R 33/385* | (2006.01) | |
| *G01R 33/58* | (2006.01) | |
| *G01R 33/565* | (2006.01) | |
| *G01R 33/561* | (2006.01) | |

(52) U.S. Cl.
CPC ....... *G01R 33/4818* (2013.01); *G01R 33/385* (2013.01); *G01R 33/56518* (2013.01); *G01R 33/56572* (2013.01); *G01R 33/583* (2013.01); *G01R 33/5616* (2013.01)

(58) Field of Classification Search
CPC ............ G01R 33/4818; G01R 33/583; G01R 33/56572; G01R 33/56518; G01R 33/385; G01R 33/5616
See application file for complete search history.

(56) References Cited

U.S. PATENT DOCUMENTS

| 6,188,219 | B1 | 2/2001 | Reeder et al. | |
|---|---|---|---|---|
| 6,323,646 | B1 * | 11/2001 | Zhou ................ | G01R 33/56341 324/309 |
| 7,064,547 | B1 * | 6/2006 | King ................. | G01R 33/5611 324/309 |
| 8,299,789 | B2 | 10/2012 | Heid et al. | |
| 2013/0234708 | A1 | 9/2013 | Goora et al. | |
| 2016/0187438 | A1 * | 6/2016 | Gui ................... | G01R 33/5659 324/309 |

OTHER PUBLICATIONS

A simple Method for MR Gradient System Characterization and k-space Trajectory Estimation, Addy et al. Magn Reson Med Jul. 2012; 68(1):120-129 (Year: 2012).*
Wieben, et al., "Correction of Trajectory Errors in Radial Acquisitions," Proceedings of the International Society of Magnetic Resonance in Medicine, vol. 11, p. 298 (2003).

(Continued)

*Primary Examiner* — G. M. A Hyder
(74) *Attorney, Agent, or Firm* — Schiff Hardin LLP

(57) ABSTRACT

In a magnetic resonance installation and a corresponding method, a scan sequence is determined based on a representation in k-space of a pulse response of a gradient system of the magnetic resonance installation.

11 Claims, 3 Drawing Sheets

(56) References Cited

OTHER PUBLICATIONS

Vannesjo et al., "Gradient System Characterization by Impulse Response Measurements with a Dynamic Field Camera," Magnetic Resonance in Medicine, vol. 69, pp. 583-593 (2013).
Vannesjo et al., "Image Reconstruction Using a Gradient Impulse Response Model for Trajectory Prediction," Magnetic Resonance in Medicine, vol. 76, pp. 45-58 (2016).
Vannesjö, Signe J., "Characterizing and Correcting for Imperfect Field Dynamics in Magnetic Resonance Imaging," Diss. ETH No. 21558, Royal Institute of Technology, Stockholm, Sweden, 2013.
Duyn et al., "Simple Correction Method for k-Space Trajectory Deviations in MRI," Journal of Magnetic Resonance, vol. 132, Issue 1, pp. 150-153 (1998).

\* cited by examiner

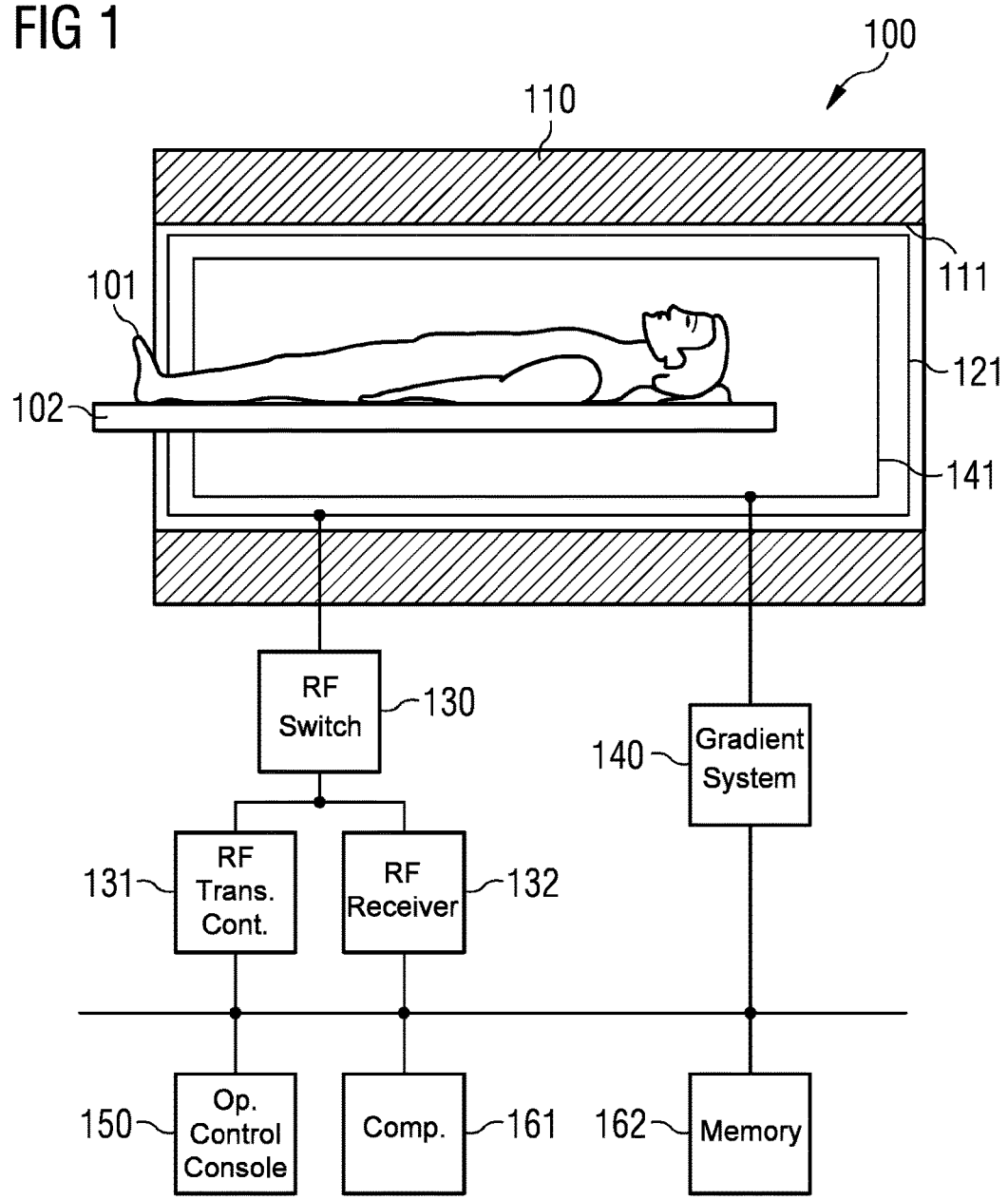

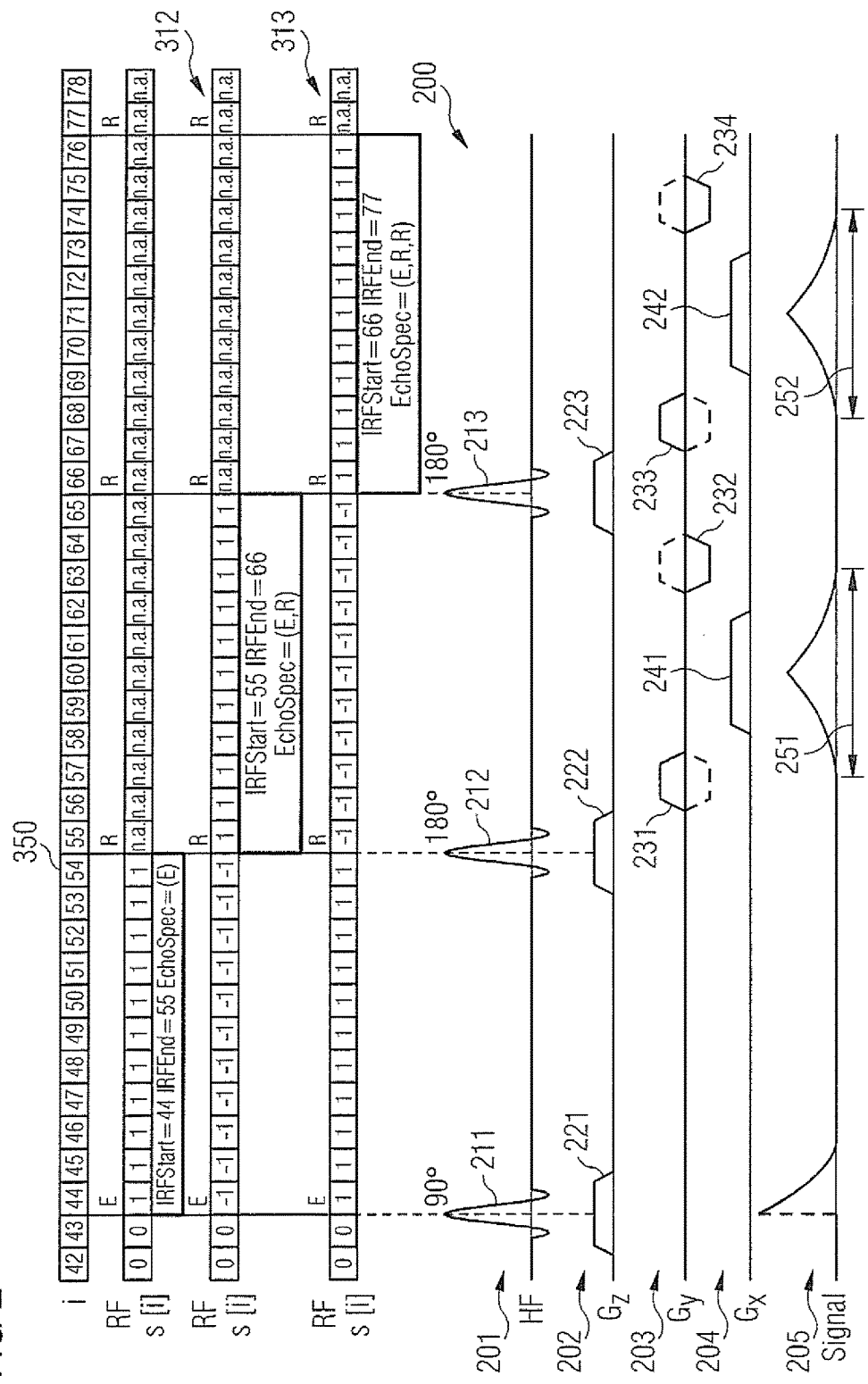

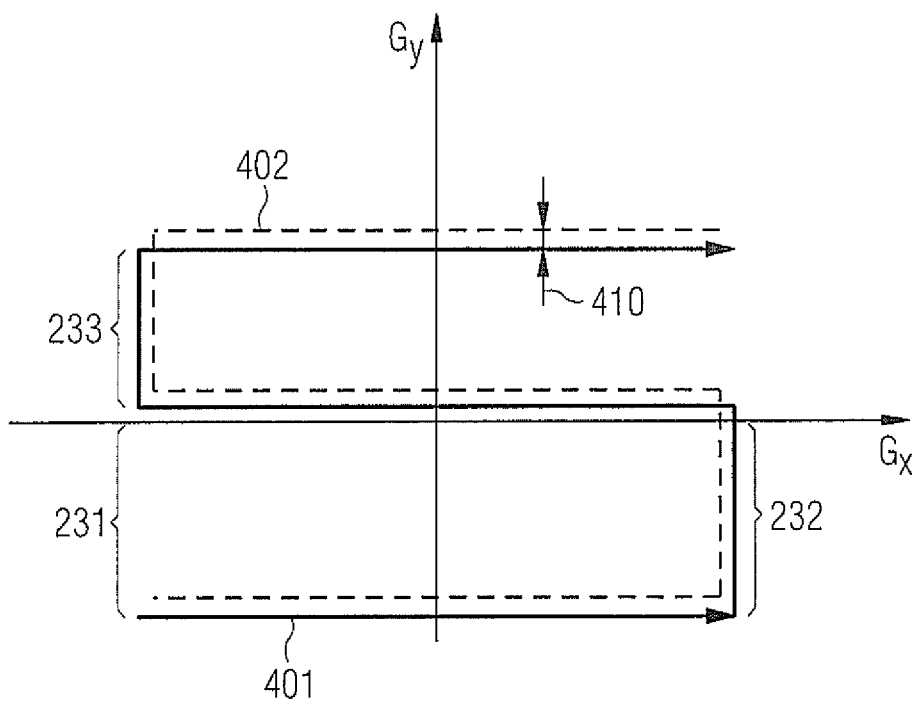

METHOD AND MAGNETIC RESONANCE APPARATUS FOR DETERMINING A SCAN SEQUENCE BASED ON A REPRESENTATION OF A PULSE RESPONSE IN K-SPACE OF THE GRADIENT SYSTEM

BACKGROUND OF THE INVENTION

Field of the Invention

The present invention concerns a magnetic resonance apparatus and method to determine a scan sequence based on a pulse response of a gradient system of the apparatus, in particular, based on a representation of the pulse response in k-space.

Description of the Prior Art

In magnetic resonance imaging, gradient fields are used to spatially encode the magnetic resonance (MR) signals that are entered into a memory organized as k-space. Spatially resolved MR images can be obtained therefrom.

The accuracy of the spatial resolution of the MR images is correlated with the accuracy with which the gradient fields that are used is known. It is frequently observed that the gradient fields designated for use deviate from gradient fields that are actually observed (gradient field errors) when the scan sequence is executed. For example, the gradient field error can occur as the result of eddy currents and/or mechanical resonances. Generally, the gradient system of the MR installation has a complicated system response between the specified or programmed gradient pulses and the gradient fields actually produced thereby.

It has been observed that gradient field errors can be particularly significant for certain scan sequences. For example, significant gradient field errors can occur in scan sequences with non-Cartesian k-space trajectories, for example spiral trajectories or trajectories with radially oriented branches. Generally, trajectories with rapid changes to the gradient fields can effect significant gradient field errors. A further example is echo planar imaging (EPI). In such cases, the gradient field error can be a function of position of the acquired data in k-space.

The gradient field error can result in artifacts such as ghosts and/or blurring in the MR images. The gradient field error may also result in reduced spatial resolution. This complicates the analysis of physical information in the MR images.

Techniques are known for reducing the gradient field error. For example, eddy current compensation can be used. A further example is retrospective correction by measuring the actual k-space trajectory. A further correction technique uses a priori knowledge on the pulse response of the gradient system as described, for example, in Vannesjö et al., "Gradient System Characterization by Impulse Response Measurements with a Dynamic Field Camera," Magnetic Resonance in Medicine, Vol. 69, No. 2, pp. 583-593 (2013); and Vannesjö et al., "Image Reconstruction Using a Gradient Impulse Response Model for Trajectory Prediction," Magnetic Resonance in Medicine (2015); and Vannesjö, "Characterizing and Correcting for Imperfect Field Dynamics in Magnetic Resonance Imaging," Dissertation, Swiss Federal Institute of Technology, ETH Zurich, No. 21558 (2013). These techniques are sometimes called GIRF techniques (GIRF=gradient impulse response function).

Reference implementations of GIRF techniques have certain drawbacks and restrictions. Although a GIRF technique can often predict the gradient fields actually used with a certain degree of accuracy, the inherent characteristic remains that the gradient system tends to function as a low pass filter. This means that, often, rapid changes to gradient fields cannot be generated or can be generated only to a restricted degree. This can result in persistent gradient field errors during the emission of RF pulses, which cause inaccuracies in the manipulation of the nuclear spin magnetization. Echo paths induced by multiple RF pulses are not taken into account.

SUMMARY OF THE INVENTION

Therefore, there is a need for improved techniques for reducing gradient field errors. There is in particular a need for techniques to alleviate or rectify the above-named drawbacks and restrictions.

An MR installation according to the invention has a radio-frequency transmitter and a radio-frequency receiver. The MR installation also has a gradient system and a memory. The MR installation also has at least one computer configured to read calibration data from the memory. The calibration data are indicative of a pulse response of the gradient system. The at least one computer is further configured, based on a representation of the pulse response in k-space, to determine a scan sequence. The scan sequence is indicative of radio-frequency pulses for the radio-frequency transmitter, for scan times for the radio-frequency receiver, and for gradient pulses for the gradient system. The at least one computer is further configured then to initiate performance of the scan sequence in order to produce a magnetization of certain nuclear spins in an examination object.

For example, the radio-frequency transmitter of the MR installation can have one or more radio-frequency coils, and the radio-frequency receiver can have one or more radio-frequency coils. The radio-frequency transmitter and the radio-frequency receiver can be coupled to one or more common radio-frequency coils via a radio-frequency switch. The radio-frequency transmitter can have a digital-analog converter and a power source. The radio-frequency receiver can have an analog amplifier and an analog-digital converter.

The gradient system can have one or more gradient coils. For example, three gradient coil pairs can be provided for the three spatial directions. The gradient system is configured to allow a current pulse to flow through the gradient coils (gradient pulse) in order to generate a gradient field as a location-dependent magnetic field.

For example, the memory can be a non-volatile memory. The memory can be a local memory or a cloud memory. The computer can be configured to receive the calibration data from a server via a communication interface, and then write the data into the memory.

The calibration data represent to a priori knowledge of the behavior of the gradient system. For example, the calibration data can be specific for the respective MR installation. Different MR installations can have different calibration data. However, it is also possible for the calibration data for different MR installations of the same type to be at least partially identical. The calibration data can contain the pulse response in explicit or parameterized form. Sometimes, the pulse response is also designated a weight function or step response. The pulse response generally designates the response of the gradient system to a fast-changing input signal supplied to the system, here a short gradient pulse. Such a system is also sometimes designated a linear time-invariant (LTI) system. For example, the input signal can be a Dirac pulse, but often it may be impossible or only restrictedly possible to generate an ideal Dirac pulse. Therefore, the pulse response can also designate the response of the system to an input signal with a finite edge duration. For example, it is possible to use a triangular function for the gradient pulse with a duration in the range 0.1 ms to 0.4 ms. For example, the triangular function could have an amplitude such that a nominal gradient field with an amplitude in the range of 5-50 mT/m is generated. Typically, the pulse response is represented inherently in the period. However, it is possible to represent the pulse response in the frequency domain as described, for example, in FIG. 2a in the aforementioned 2013 journal article by Vannesjö.

Different examples described herein are based on the use of a representation of the pulse response in k-space. K-space is sometimes also called the spatial frequency domain. K-space defines the spatial frequency components of the MR image. The MR data representing the MR signals acquired during the scan times are entered into a memory organized as k-space. Therefore, the raw MR data are often also designated as k-space. A Fourier transformation from the spatial frequency domain into the image domain then produces the MR image data. Accordingly, integration of the amplitude of the gradient fields over time can be used to transfer the representation of the pulse response in the time domain into the representation of the pulse response in k-space.

The scan sequence can be determined, for example, based on a specified scan protocol. The scan protocol can be selected by a user based on clinical boundary conditions. The scan protocol is sometimes also designated a clinical protocol. The scan protocol defines the boundary conditions for the scan sequence. For example, the scan protocol can specify the contrast to be generated in the MR image, i.e. whether a T1-weighted MR image or a T2-weighted MR image is to be generated. The scan protocol may specify whether a spin echo scan sequence or a gradient echo scan sequence is to be used. The scan protocol may specify the resolution the MR image is to have. The scan protocol may specify which region of interest of an examination object is to be depicted by the MR image. The scan protocol may specify whether the MR image should contain specific encoding in the MR image, for example diffusion encoding or fat/water encoding. Proceeding from the scan protocol, it is then possible, based on the representation of the pulse response in k-space, to determine specific values for the radio-frequency pulses such as start time, end time, duration, amplitude, amplitude modulation, etc.; specific values for the scan times such as start time, end time, sampling bandwidth, etc.; and/or specific values for the gradient pulses such as start time, end time, slew rate, amplitude, or generally interpolation points, etc. This enables the scan sequence to be determined.

Initiation of the performance of the scan sequence can be implemented by transmission of control data to a sequence controller of a data acquisition scanner of the MR apparatus, wherein the control data represent the scan sequence. Initiation of the performance of the scan sequence can be done by accessing stored control data from a memory for the later performance of the scan based on the control data. Initiation of the performance of the scan sequence can include the performance of the scan sequence itself.

Taking the representation of the pulse response in k-space into account enables a particularly accurate prediction of the position of the magnetization in k-space. Taking the representation of the pulse response in k-space into account enables the scan sequence to be determined such that the position of the acquired data entries in k-space satisfies a specification, for example in the form of a reference trajectory, particularly well. Entry of the acquired MR data at respective data entry points in k-space is called sampling k-space.

For example, the representation of the pulse response in k-space can be determined as follows:

$$KIRF[i] = \Delta t \cdot GIRF[i-1], \tag{1}$$

wherein i indicates a discrete sampling interval, GIRF is the representation of the pulse response in the time domain, and $\Delta t$ is the duration of the discrete sampling interval. In some examples, it could also be possible to use sampling intervals of variable duration, i.e. $\Delta t = \Delta t[i]$.

The sampling intervals can also be designated interpolation points. The quantity of interpolation points is expressed by: $G[i_t]$, wherein $i_t$ indicates the interpolation points. Hence, the time is obtained as: $t = i_t \Delta t$, as long as $\Delta t$ is constant. This means that the scan sequence can be divided into sampling intervals for the determination.

In some examples, the at least one computer is configured to determine a k-space trajectory of the data based on the representation of the pulse response in k-space and based on the gradient pulses.

The gradient pulses can be used to impress a moment on the spin magnetization, which produces a shift in the position of the corresponding data in k-space. The gradient pulses produce gradient fields; these gradient fields can be determined particularly accurately based on the representation of the pulse response in k-space. Therefore, the impressed moment can be determined particularly accurately and hence the position of the data representing the magnetization in k-space can be determined particularly accurately.

For example, the at least one computer can be configured to determine a k-space trajectory based on a convolution between the representation of the pulse response in k-space and the gradient pulses.

The convolution can be calculated as follows:

$$K[i] = \Sigma_k KIRF[k] \cdot G[i-k], \tag{2}$$

wherein K[i] designates the position of the magnetization data in k-space in the sampling interval i and G[i-k] designates the amplitude of the gradient pulse at the time i-k. The quantity of all K[i], which may be sorted, then designates the k-space trajectory.

The position of the magnetization data can be calculated for different echo paths separately based on Equation (2). An echo path can be defined proceeding from an echo of the magnetization, i.e. for example constructive superimposition of the magnetization in a spatial region.

It can sometimes be desirable also to take account of the influence of the radio-frequency pulses on the k-space trajectory, i.e. the correct treatment of different echo paths. For example, the at least one computer can be configured further to determine the k-space trajectory based on a manipulation of the magnetization effected by the radio-frequency pulses. For example, the k-space trajectory could further be determined based on one or more of the radio-frequency pulses. For example, it is possible to use refocusing pulses or 180° pulses to modify the position of the magnetization in k-space, for example, to reflect it at the center of k-space. It is possible to use excitation pulses to tip the magnetization out of the rest position along a basic magnetic field of the MR installation.

Taking account of the influence of the RF pulses enables the k-space trajectory to be determined directly taking account of the RF pulses; subsequent adaptation of the RF pulses can be dispensed with. For example, the RF pulses can be taken into account as optimization variables in a corresponding optimization.

For example, the sampling intervals can be aligned on the time centers of the RF pulses. This can be desirable because it can then be assumed that the manipulation of the magnetization takes place instantaneously at the time center of the RF pulses, i.e. at the boundary between two adjacent sampling intervals. This makes it particularly simple to take account of the influence of the RF pulses. However, in other examples, it is possible to use more complicated models describing the interaction between the RF pulses and the magnetization.

In general, there are $N_{RF}$ RF pulses, which are indicated by $i_{RF} \in \{0, \ldots, N_{RF}-1\}$. This produces $N_{RF}$ time segments in the scan sequence, which, for purposes of simplicity, can also be designated $i_{RF}$. Each RF pulse can be localized by a start subscript $i_{Start,i_{RF}}$ and an end subscript $i_{Ende,i_{RF}}$ in the time domain.

It is now possible to determine a prefix value $s[i_{RF},i]$ for each time segment $i_{RF}$ and for each sampling interval $i_t$ in accordance with the echo path in question. Then, the following is obtained for the position of the magnetization in k-space:

$$K[i_t] = \Sigma_{i_{RF}=0}^{N_{IRF}-1} KIRF[i_{IRF}] \cdot G[i_t - i_{IRF}] \cdot s[i_{RF}, i_t - i_{IRF}], \quad (3)$$

wherein: $i_{Start,i_{RF}} \leq i_t \leq i_{Ende,i_{RF}}$. Equation (3) corresponds to Equation (2), wherein now the echo paths generated by RF pulses are taken into account by $s[i_{RF},i]$.

With reference to Equation (3), it should be noted that, depending upon the scan sequence, it can be necessary to consider more than one echo path per sampling interval. One possible example is a DESS (dual echo at steady state) scan sequence. This can also be taken into account by an additional subscript for s and k.

Proceeding from Equations (2) and (3), it is then possible to resolve the corresponding linear equation system in order to determine the gradient pulses G. Herein, the positions in k-space can be specified according to a reference k-space trajectory. For example, the reference k-space trajectory could be specified by the scan protocol. For example, the reference k-space trajectory could be a Cartesian trajectory or a spiral trajectory. Other trajectory shapes are also possible.

Values obtained, for example, by optimization can then be used as the basis for the determination of the actual k-space trajectory. Generally, the actual k-space trajectory will have a certain deviation compared to the reference k-space trajectory, such as due to further boundary conditions to be observed and/or further optimization criteria. Therefore, the computer can generally be configured to determine the scan sequence such that any deviation between the reference k-space trajectory defined in the scan protocol and the k-space trajectory is optimized. For example, it can be desirable to minimize this deviation.

In principle, it is possible to use different techniques for optimization, such as numerical optimization. Examples include a simplex method, a gradient method, an interval-halving method, etc. Discrete-time optimization can be performed with the sampling intervals i[t] according to Equations (2) or (3). The discrete-time optimization allows different—under some circumstances conflicting—optimization criteria and one or more boundary conditions to be taken into account when determining the scan sequence. This can achieve a particularly good result for the scan sequence with respect to one or more target criteria.

For example, the length of the sampling intervals can correspond to the length of scanning intervals of the gradient system. The sampling intervals of the gradient system can specify the time resolution with which changes to the gradient pulses can be implemented. For example, the length of the sampling intervals of the gradient system can correspond to a bandwidth of the digital-analog converter of the gradient system, which is configured to generate the coil current through the gradient coils. For example, the length of the sampling intervals can be no more than 100 µs, optionally no more than 20 µs, further optionally no more than 10 µs. The use of such short sampling intervals enables the influence of RF pulses on the k-space trajectory to be taken into account particularly accurately.

The optimization can optionally take account of one or more boundary conditions and/or optimization variables. An optimization variable can be the distance between the reference k-space trajectory and the actual k-space trajectory. Further boundary conditions and/or optimization variables can be selected from the following group: the slew rate of the gradient pulses; the radio-frequency energy of the radio-frequency pulses per time unit; the scanning duration for performing the scan sequence; the contrast of the scan protocol; the image resolution of the scan protocol; and the echo time between the radio-frequency pulses and the scan times.

For example, the slew rate of the gradient pulses can be limited since otherwise high forces can act on the gradient system and the MR installation. For example, the slew rate of the gradient pulses can be limited by a noise level effected by the motion of the gradient coils—which are excited by the edges of the gradient pulses.

For example, the radio-frequency energy of the radio-frequency pulses per time unit can be limited by physiological limit values of an examination subject's exposure to radio frequencies. One example is the specific absorption rate (SAR), which indicates the maximum radio-frequency power per time unit that can be absorbed by the examination subject.

The scanning duration can describe the entire time required to perform the scan sequence. It can be desirable to implement short scanning durations. This can enable the time of MR imaging to be limited for an examination subject and hence make the experience agreeable for the subject.

Therefore, the optimization can take account of the deviation between the reference k-space trajectory and the k-space trajectory as an optimization variable. Herein, at least in some sampling intervals, this deviation can be taken into account as an optimization variable. For example, it is possible for the optimization to take account of the deviation as an optimization variable at least in sampling intervals during the radio-frequency pulses and/or during the gradient pulses. Alternatively or additionally, it is possible for the optimization to take account of the deviation as an optimization variable at least in sampling intervals during the scan times. This can result, at least during the radiation of a radio-frequency pulses and/or during the reception of an MR signal, in the exact position of the magnetization data in k-space being known. This enables the MR image to be determined with high spatial resolution or with minimal artifacts.

It may not be necessary, however, for the actual k-space trajectory of a reference k-space trajectory to be continuous in all sampling intervals during the scanning duration. In other words, it may not be necessary for the reference k-space trajectory to be defined in all sampling intervals. For example, it would be possible for the optimization not to take account of the deviation between the reference k-space trajectory and the k-space trajectory as an optimization variable at least in some or all sampling intervals between radio-frequency pulses and scan times. In some examples, in sampling intervals between the radio-frequency pulses and the scan times, the optimization can have complete or considerable freedom in the choice of k-space trajectory for the magnetization. This can make it possible also to satisfy or optimize other boundary conditions and/or optimization variables of the optimization particularly effectively. The accessible parameter space for the optimization can be enlarged.

In one example, the inventive method includes reading calibration data from a memory of a MR installation. The calibration data are indicative of a pulse response of a gradient system of the MR installation. The method further includes determination of a scan sequence based on a representation of the pulse response in k-space. The scan sequence is indicative of radio-frequency pulses for a radio-frequency transmitter of the MR installation, for scan times for a radio-frequency receiver of the MR installation and for gradient pulses for the gradient system. The method also includes initiation of the performance of the scan sequence to produce a magnetization of certain nuclear spins in an examination object.

The method can be performed by the MR installation according to further examples described herein.

The inventive method achieves effects corresponding to those achieved by the inventive MR installation according to the further examples described herein.

The present invention also encompasses a non-transitory, computer-readable data storage medium encoded with programming instructions (program code) that, when the storage medium is loaded into a computer or computer system of a magnetic resonance apparatus, cause the MR apparatus to implement any or all of the embodiments of the method according to the invention, as described above.

The features described above and features described below can be used not only in the corresponding explicitly described combinations, but also in further combinations or in isolation, without departing from the scope of the present invention.

BRIEF DESCRIPTION OF THE DRAWINGS

FIG. 1 is a schematic illustration of an MR installation according to the invention.

FIG. 2 is a schematic illustration of a scan sequence with radio-frequency pulses, gradient pulses, and scan times according to the invention.

FIG. 3 is a schematic illustration of a k-space trajectory and a reference k-space trajectory for use in explaining the invention.

DESCRIPTION OF THE PREFERRED EMBODIMENTS

The above-described properties, features and advantages of this invention and the way in which they are achieved will become clearer and more easily understandable in connection with the following description of the exemplary embodiments, which will be explained in more detail in connection with the drawings.

The following describes the present invention with reference to preferred embodiments and with reference to the drawings. In the figures, the same reference numbers designate the same or similar elements. The figures are schematic presentations of different embodiments of the invention. Elements depicted in the figures are not necessary shown true-to-scale. Instead, the different elements shown in the figures are depicted such that their function and general purposes can be understood by the person skilled in the art. Connections and couplings between functional units and elements depicted in the figures can also be implemented as indirect connections or couplings. A connection or coupling can be implemented as hardware, software or a combination of hardware and software.

The following explains techniques for the prospective correction of errors in gradient fields during MR imaging. The techniques are based on the consideration of the pulse response of a corresponding gradient system of the MR installation. Herein, a representation of the pulse response in k-space is used. The representation of the pulse response in k-space enables the actually functioning gradient fields to be predicted particularly accurately. For example, it can then be possible to minimize the deviation between a reference k-space trajectory of the magnetization and an actual k-space trajectory. To this end, it is possible to perform an optimization.

Such a k-space-based approach, which takes account of the pulse response of the gradient system, enables errors in the gradient fields to be taken into account during the entire scanning duration of the scan sequence—and not only from excitation to the scan time directly following excitation. The k-space trajectory can be taken into account consistently over the entire scanning duration. This enables errors in the position of the magnetization in k-space to be reduced. This can in particular be desirable in the case of scan sequences with one or more spin echoes. In particular, this can reduce the need for retrospective correction of the position of the magnetization in k-space. This enables particularly simply generated MR images, which are nevertheless of high quality.

FIG. 1 is a schematic illustration of an MR installation 100, which can be used to carry out the above-described techniques and the techniques described below. The MR installation 100 has a data acquisition scanner with a basic field magnet 110 defining a tube 111. The magnet 110 generates the basic magnetic field parallel to its longitudinal axis.

An examination object, here a patient 101 can be moved into the magnet 110 lying on a table 102. A region of interest of the patient 101 can be taken into account during the MR imaging. In the example in FIG. 1, the region of interest is the head of the patient 101.

The MR installation 100 further has a gradient system 140 for the generation of gradient fields used for MR imaging and spatial encoding of the acquired MR data. The gradient system 140 typically has at least three separately controllable gradient coils 141 in clearly defined positions with respect to one another. The gradient coils 141 have gradient pulses supplied thereto that generate gradient fields along specific spatial directions (gradient axes). These gradient axes define a machine coordinate system. The gradient fields can be used for slice selection, frequency encoding (in the readout direction) and for phase encoding. This enables spatial encoding of the MR data to be achieved. The maximum rate of change and the maximum amplitude of the gradient pulses for each gradient coil 141 are typically limited by corresponding limit values (slew rate).

An RF coil arrangement 121 is provided that is operable to radiate an amplitude-modulated and/or frequency-modulated RF excitation pulse into the examination subject 101. This gives certain nuclear spins in the patient 101 a transverse magnetization that causes those spins to deviate from the basic magnetic field. The so-called flip angle of the RF excitation pulse defines the degree of deflection. The flip angle of the RF excitation pulse is correlated with the amplitude or transmit power of the RF excitation pulse. The transmit power of the RF excitation pulse is typically constrained by a corresponding limit value. The limit value can be determined by technical limits of hardware and/or physiological limits of the patient 101, for example the SAR. To generate RF excitation pulses of this kind, an RF transmitter controller 131 is connected to the RF coil arrangement 121 via an RF switch 130. The RF transmitter controller 131 can include an RF generator and an RF amplitude modulator. The RF excitation pulses can tip the transverse magnetization 1D slice-selectively or 2D/3D locally-selectively or globally out of the rest position produced by the basic magnetic field. Alternatively or additionally to the RF excitation pulses, it is also possible for RF refocusing pulses to be radiated.

Furthermore, a RF receiver 132 is connected to the RF coil arrangement 121 via the RF switch 130. The RF receiver 132 acquires or measures MR signals of the relaxing transverse magnetization as MR data, for example by inductive coupling into the RF coil arrangement 121.

The MR installation 100 further has an operator control console 150, which can include, for example, a screen, a keyboard, a mouse etc. The operator control console 150 can be used to acquire user inputs and provide outputs for the user. For example, the operator control console 150 can be used to set individual operating modes or operating parameters for the MR installation 100 by the user and/or automatically and/or remotely.

The MR installation 100 also has a computer 161. For example, the computer 161 could be a processor, a microprocessor or a microcontroller. The computer 161 may also be a field-programmable array (FPGA) or an application-specific integrated circuit (ASIC). The MR installation 100 also has a memory 162. Control protocols can be stored in the memory 162, so the control protocols can be respectively accessed by the computer 161. Execution of a control protocol by the computer 161 causes the computer 161 to operate the scanner so as to execute a scan sequence defined by the protocol, based on a representation of the pulse response of the gradient system 140 in k-space according to different examples described herein.

FIG. 2 illustrates a scan sequence 200 (lower part of FIG. 2), which can be determined by the different techniques described herein. The time axis in FIG. 2 is not true-to-scale. The scan sequence 200 includes radio-frequency pulses 211-213. The radio-frequency pulses 211-213 are assigned to a transmit channel 201. The transmit channel 201 corresponds to an actuation of the radio-frequency transmitter controller 131. Parameters of the RF pulses 211-213 that can be determined in connection with the scan sequence include: start time, end time, amplitude, amplitude modulation, etc.

In particular, the scan sequence 200 includes an excitation pulse 211, which tips the magnetization out of the rest position and hence generates transverse magnetization. The transverse magnetization of the nuclear spins can then be modified, for example by gradient fields 221-223, 231, 241-242 or by refocusing pulses 212, 213. Simultaneously with the excitation pulse 211, a gradient pulse 221 is applied on the Z-channel 202 of the gradient system 140. The gradient pulse 221 defines the slice in which the magnetization is excited by the excitation pulse 211. The slice has a specific Z position, i.e. a specific position along the longitudinal axis of the tube 111 and along a coil axis of the coil for generating the basic magnetic field. Therefore, the gradient pulse 221 is sometimes also designated a slice selection gradient. During the refocusing pulses 212, 213, further gradient pulses 222, 223 are applied to the Z-channel 202 of the gradient system 140 in order to address the same slice.

The slice selection specifies a plane within which the k-space trajectory subsequently used to readout the magnetization is arranged. The k-space trajectory is further defined by a phase encoding gradient pulse 231 and readout gradient pulses 241, 242. The parameters of these gradient pulses 231, 241, 242 can be determined, for example start time, end time, slew rate, amplitude, etc.

The gradient pulses 241, 242 are applied during scan times 251, 252 on a readout channel 205, which defines the actuation of the radio-frequency readout system 132. As a result, different time positions within the scan times 251, 252 correspond to different positions in k-space in the X direction; therefore, the gradient pulses 241, 242 are assigned to the X-channel 204 of the gradient system 140. The sequential use of different amplitudes for the gradient pulses 231 (dashed lines in FIG. 2) enables different lines of k-space, spaced apart in the Y direction, to be addressed. Therefore, the phase encoding gradient pulses 231 are applied on the Y-channel 203 of the gradient system 140.

The scan sequence 200 according to the example in FIG. 2 implements a spin echo scan sequence. This is the case because the refocusing pulses 212, 213 form spin echoes during the scan times 251, 252. In other examples, it would also be possible to use other types of scan sequence, for example GRE-scan sequences, etc.

FIG. 3 illustrates aspects with respect to a k-space trajectory 402 (dashed line) obtained for the scan sequence 200 according to reference implementations. It is evident from FIG. 3 that the k-space trajectory 402 has a certain deviation 410 from a Cartesian reference k-space trajectory 401. According to the different techniques described herein, it can be possible to reduce this deviation 410 by taking account of the representation of the pulse response of the gradient system 140 in k-space.

For example, the k-space trajectory 402 could be implemented multiple times with offset k-space lines.

To refer again to FIG. 2: for example Equation (2) or Equation (3) can be used for this purpose. This means that the representation of the pulse response in k-space can be taken into account in order to bring the actual k-space trajectory 402 as closely as possible into conformity with the reference k-space trajectory 401. To this end, it is possible to determine the different parameters of the scan sequence 200, for example the parameters relating to the RF pulses 211-213 and/or relating to the gradient pulses 231, 241, 242. It is also possible for the time alignment of the different elements of the scan sequence 200 to be varied. The amplitudes of the gradient pulses 231, 241-242 can be determined, for example, by solving Equation (2) using the reference k-space trajectory 401. To this end, it is possible to use discrete-time numerical optimization. The optimization can take account of the distance 410 as an optimization variable.

FIG. 2 also depicts the values of s[i] according to Equation (3) for different sampling intervals 350. This enables the k-space trajectory 402 to be determined based on a manipulation of the magnetization effected by the RF pulses 211-213. In the example in FIG. 2, it is evident that the duration of the sampling intervals 350 is dimensioned comparatively short. The sampling intervals 350 can have a length equal to the length of scanning intervals of the gradient system 140. In many examples, this can ensure that the transition between adjacent sampling intervals 350 for the different radio-frequency pulses 211-213 is synchronized with a maximum value of the respective radio-frequency pulse 211-213 (see vertical dashed lines in FIG. 2). This makes it particularly simple to take account of the influence of the RF pulses 211-213 on the magnetization. If the maximum value is within a sampling interval 350, this can be taken into account accordingly.

FIG. 2 depicts the values of s[i] for the echo paths 312, 313 each of which correspond to the scan times 251 or 252. It is evident from this that the values of s[i] in each case change the prefix with respect to the refocusing pulses 212, 213.

For example, the reference k-space trajectory can be taken into account selectively during the RF pulses 211-213 and/or during the scan times 251, 252 as a specification for the optimization, i.e. for example during the sampling intervals "43" and "44"; however, in the sampling intervals between the RF pulses 211-213 and the scan times 251, 252—for example in the sampling intervals "45"-"53" or "56"-"58" any trajectory considered to be favorable by the optimizer can be implemented.

The features of the above-described embodiments and aspects of the invention can be combined with one another. In particular, the features can be used not only in the described combinations, but also in other combinations or for on their own without departing from the scope of the invention.

While, for example, different examples relating to the $0^{th}$ order of the moments effected by the gradient fields were taken into account above, in some examples, it can also be possible to take account of higher order influences of the gradient fields on the moments of the magnetization. This can, for example, be desirable with respect to the quantification of flux phenomena or flux compensation or diffusion.

The above-described different techniques for the determination of the scan sequence were described for purposes of illustration. These techniques can, for example, be combined with the techniques as described with reference to U.S. Pat. No. 8,299,789 B2, the disclosure of which is incorporated herein by reference. Therein, use is also made of sampling intervals to determine the influence of RF pulses on the magnetization.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) apparatus comprising:
an MR data acquisition scanner comprising a radio-frequency (RF) transmitter and an RF receiver and a gradient coil arrangement;
a memory in which calibration data are stored that describe a pulse response in k-space of said gradient coil arrangement;
a computer having access to said memory and being configured to read said calibration data from said memory; and
said computer being configured to determine a scan sequence, based on said pulse response in k-space of said gradient coil arrangement described in said calibration data, for operating said MR data acquisition scanner, said scan sequence comprising RF pulses to be radiated by said RF transmitter and scan times for reception of MR signals by said RF receiver, and gradient pulses activated by said gradient coil arrangement, to operate said MR data acquisition scanner according to said scan sequence in order to acquire MR data from an examination object in said MR data acquisition scanner, to make the acquired data available from the computer in electronic form as a data file, to determine a k-space trajectory, for entering the acquired MR data into k-space, dependent on said pulse response in k-space represented in said calibration data, and dependent on said gradient pulses of said scan sequence, wherein said RF pulses in said scan sequence manipulate magnetization of certain nuclear spins in the examination subject, and to determine said k-space trajectory dependent on said manipulation of the magnetization of said certain nuclear spins.

2. An MR apparatus as claimed in claim 1 wherein said computer is configured to determine said k-space trajectory from a convolution between the representation in said calibration data of the pulse response in k-space, and said gradient pulses in said scan sequence.

3. An MR apparatus as claimed in claim 1 wherein said computer is configured to determine said scan sequence by optimizing a difference between said determined k-space trajectory and a reference k-space trajectory defined in a predetermined scan protocol.

4. An MR apparatus as claimed in claim 1 wherein said computer is configured to determine said scan sequence by implementing a discrete-time optimization of at least a part of said scan sequence.

5. An MR apparatus as claimed in claim 4 wherein said discrete-time optimization comprises sampling intervals and wherein said gradient pulses in said scan sequence define scanning intervals of said gradient coil arrangement, and wherein said computer is configured to set a length of the sampling intervals in said discrete-time optimization so as to equal a length of said scanning intervals of said gradient coil arrangement.

6. An MR apparatus as claimed in claim 4 wherein said computer is configured to implement said discrete-time optimization so as to take account of at least one boundary condition or optimization variable selected from the group consisting of a slew rate of the gradient pulses, RF energy of said RF pulses per time unit, scanning duration for performance of said scan sequence, contrast of image data produced with said scan protocol, image resolution of image data produced with said scan protocol, and an echo time that occurs in said scan protocol.

7. An MR apparatus as claimed in claim 4 wherein said computer is configured to determine said scan sequence by optimizing a difference between said determined k-space trajectory and a reference k-space trajectory defined in a predetermined scan protocol, and wherein said discrete-time optimization comprises sampling intervals and wherein said computer is configured, in at least some of said sampling intervals, to use said deviation as an optimization variable.

8. An MR apparatus as claimed in claim 7 wherein said computer is configured, at least in sampling intervals during said RF pulses and/or during said gradient pulses, to use said deviation as said optimization variable.

9. An MR apparatus as claimed in claim 8 wherein said computer is configured, in at least some sampling intervals that occur between said RF pulses and scan times, to implement said discrete-time optimization without taking account of said deviation.

10. A method for operating a magnetic resonance (MR) apparatus comprising an MR data acquisition scanner having a radio-frequency (RF) transmitter, an RF receiver, a gradient coil arrangement and a computer, said method comprising:

storing calibration data in a memory that describe a pulse response in k-space of said gradient coil arrangement;

with a computer, accessing said memory and reading said calibration data from said memory; and in said computer, determining a scan sequence, based on said pulse response in k-space of said gradient coil arrangement described in said calibration data, for operating said MR data acquisition scanner, said scan sequence comprising RF pulses to be radiated by said RF transmitter and scan times for reception of MR signals by said RF receiver, and gradient pulses activated by said gradient coil arrangement, operating said MR data acquisition scanner according to said scan sequence in order to acquire MR data from an examination object in said MR data acquisition scanner, making the acquired data available from the computer in electronic form as a data file, determine a k-space trajectory, for entering the acquired MR data into k-space, dependent on said pulse response in k-space represented in said calibration data, and dependent on said gradient pulses of said scan sequence, wherein said RF pulses in said scan sequence manipulate magnetization of certain nuclear spins in the examination subject, and determine said k-space trajectory dependent on said manipulation of the magnetization of said certain nuclear spins.

11. A non-transitory, computer-readable data storage medium encoded with programming instructions, said storage medium being loaded into a computer system of a magnetic resonance (MR) apparatus that comprises an MR data acquisition scanner having a radio-frequency (RF) transmitter, an RF receiver, a gradient coil arrangement, and a memory, said programming instructions causing said computer system to:

access a memory in which calibration data are stored that describe a pulse response in k-space of said gradient coil arrangement and read said calibration data from said memory; and determine a scan sequence, based on said pulse response in k-space of said gradient coil arrangement, for operating said MR data acquisition scanner, said scan sequence comprising RF pulses to be radiated by said RF transmitter and scan times for reception of MR signals by said RF receiver, and gradient pulses activated by said gradient coil arrangement, operate said MR data acquisition scanner according to said scan sequence in order to acquire MR data from an examination object in said MR data acquisition scanner, make the acquired data available from the computer in electronic form as a data file, to determine a k-space trajectory, for entering the acquired MR data into k-space, dependent on said pulse response in k-space represented in said calibration data, and dependent on said gradient pulses of said scan sequence, wherein said RF pulses in said scan sequence manipulate magnetization of certain nuclear spins in the examination subject, and to determine said k-space trajectory dependent on said manipulation of the magnetization of said certain nuclear spins.

* * * * *